(12) United States Patent
Fujita et al.

(10) Patent No.: US 11,921,283 B2
(45) Date of Patent: Mar. 5, 2024

(54) VIBRATING ELEMENT

(71) Applicant: FUNAI ELECTRIC CO., LTD., Osaka (JP)

(72) Inventors: Kenichi Fujita, Osaka (JP); Kenji Tanehashi, Osaka (JP); Fuminori Tanaka, Osaka (JP)

(73) Assignee: FUNAI ELECTRIC CO., LTD., Osaka (JP)

( * ) Notice: Subject to any disclaimer, the term of this patent is extended or adjusted under 35 U.S.C. 154(b) by 524 days.

(21) Appl. No.: 17/331,639

(22) Filed: May 27, 2021

(65) Prior Publication Data
US 2021/0382297 A1 Dec. 9, 2021

(30) Foreign Application Priority Data

Jun. 3, 2020 (JP) ................ 2020-096766

(51) Int. Cl.
| | | |
|---|---|---|
| G02B 26/10 | (2006.01) | |
| B81B 3/00 | (2006.01) | |
| B81C 1/00 | (2006.01) | |
| G02B 26/08 | (2006.01) | |
| G06K 7/10 | (2006.01) | |
| H02K 5/173 | (2006.01) | |
| H02K 33/00 | (2006.01) | |
| H02K 41/00 | (2006.01) | |

(52) U.S. Cl.
CPC ......... *G02B 26/0833* (2013.01); *B81B 3/004* (2013.01); *B81C 1/00658* (2013.01); *G02B 26/101* (2013.01); *B81B 2201/042* (2013.01); *B81B 2203/0109* (2013.01)

(58) Field of Classification Search
CPC .......... G02B 26/10; G06K 7/10; H02K 33/02; H02K 41/00; H02K 5/173
USPC ................................. 310/15, 51, 81
See application file for complete search history.

(56) References Cited

U.S. PATENT DOCUMENTS

| | | |
|---|---|---|
| 5,557,444 A | 9/1996 | Melville et al. |
| 5,751,465 A | 5/1998 | Melville et al. |
| 6,288,816 B1 | 9/2001 | Melville et al. |
| 8,654,423 B2 | 2/2014 | Brown |
| 8,681,410 B2 | 3/2014 | Takeda |

(Continued)

FOREIGN PATENT DOCUMENTS

| | | |
|---|---|---|
| EP | 2749526 | 7/2014 |
| EP | 3739373 | 11/2020 |

(Continued)

*Primary Examiner* — Jose A Gonzalez Quinones
(74) *Attorney, Agent, or Firm* — JCIPRNET

(57) ABSTRACT

A vibrating element includes a movable part, a substrate made of metal, a driving source, and a holding member holding the substrate. The substrate includes a pair of support beam parts, a support part, and a torsion beam part. Each of the support beam parts has a first end part and a second end part. The support part supports the first end part. The torsion beam part swingably supports the movable part. The second end part of each of the support beam parts is provided with a fixing part fixed to the holding member. By adjusting an inclination with respect to the holding member, the fixing part is fixed to the holding member in a state in which each of the support beam parts applies tension to the torsion beam part in a direction away from the movable part in a first direction in which the torsion beam part extends.

10 Claims, 11 Drawing Sheets

(56) References Cited

U.S. PATENT DOCUMENTS

| | | | | |
|---|---|---|---|---|
| 2003/0039089 A1* | 2/2003 | Lee | ................... | G02B 26/0841 |
| | | | | 361/283.1 |
| 2010/0014142 A1 | 1/2010 | Akedo et al. | | |
| 2019/0229257 A1* | 7/2019 | Masuda | ................ | B81B 7/0006 |

FOREIGN PATENT DOCUMENTS

| | | | |
|---|---|---|---|
| JP | 2001523350 | | 11/2001 |
| JP | 2005321663 | | 11/2005 |
| JP | 2011027881 | | 2/2011 |
| JP | 2012058527 | | 3/2012 |
| JP | 2012068300 A | * | 4/2012 |
| JP | 2012068424 A | * | 4/2012 |
| JP | 2013518297 | | 5/2013 |
| WO | WO-2012020788 A1 * | 2/2012 | ......... G02B 26/0833 |

* cited by examiner

VIBRATING ELEMENT

CROSS-REFERENCE TO RELATED APPLICATION

This application claims the priority benefit of Japan application serial no. 2020-096766, filed on Jun. 3, 2020. The entirety of the above-mentioned patent application is hereby incorporated by reference herein and made a part of this specification.

BACKGROUND

Technical Field

The disclosure relates to a vibrating element.

Related Art

Conventionally, a vibrating element is known (for example, see Patent Document 1: Japanese Patent Application Laid-Open No. 2005-321663).

Patent Document 1 discloses a micromirror device which includes a micromirror, a torsion bar rotatably supporting the micromirror, and a drive electrode driving the micromirror.

Here, in the micromirror device disclosed in Patent Document 1, the torsion bar is configured to be soft in order to increase the rotation angle of the mirror at a low voltage. However, to the torsion bar, not only is a rotational torque generated when the micromirror is rotated (swung) applied, but a force in the vertical direction is also applied due to the weight of the micromirror and the like. Therefore, if the torsion bar is made soft, bending occurs in the torsion bar due to the force in the vertical direction, and displacement other than mirror rotation (swinging of the mirror part) is likely to occur in the micromirror. Further, although not specified in Patent Document 1, it is considered that the occurrence of bending in the torsion bar resulting from the effect of heat generated when the micromirror is swung leads to displacement other than mirror rotation in the micromirror.

Therefore, in the micromirror device disclosed in Patent Document 1, to suppress displacement other than swinging of the mirror, the rigidity in the vertical and horizontal directions is increased as compared to the rotation direction by applying tension to the torsion bar. Specifically, in the configuration disclosed in Patent Document 1, by performing film formation on the torsion bar so as to have a tensile stress, the rigidity in the vertical and horizontal directions is increased as compared to the rotation direction. Therefore, in the configuration disclosed in Patent Document 1, the rigidity of the torsion bar in the vertical and horizontal directions is increased by forming an oxide film on the torsion bar.

However, in the micromirror device (vibrating element) described in Patent Document 1, in order to suppress displacement other than swinging of the micromirror (movable part), film formation is performed on the torsion bar (torsion beam part). Since the film formation process includes a large number of processes such as mask formation, resist coating, thin film formation, and resist removal, the manufacturing process may be complicated.

The disclosure provides a vibrating element capable of suppressing occurrence of displacement other than swinging in a movable part while suppressing complication of the manufacturing process.

SUMMARY

A vibrating element according to an embodiment of the disclosure includes a movable part, a substrate made of metal, a driving source, and a holding member. The substrate includes a pair of support beam parts, a support part, and a torsion beam part. The pair of support beam parts each has a first end part and a second end part. The support part supports the first end part of each of the pair of support beam parts. The torsion beam part swingably supports the movable part. The driving source is provided on the support part and generates a plate wave which swings the movable part. The holding member holds the substrate. The second end part of each of the pair of support beam parts is provided with a fixing part fixed to the holding member. By adjusting any of an inclination with respect to the holding member, a fixing position with respect to the holding member in a fixing plane along a front surface of the substrate, and a fixing orientation in the fixing plane, the fixing part is fixed to the holding member in a state in which each of the pair of support beam parts applies tension to the torsion beam part in a direction away from the movable part in a first direction in which the torsion beam part extends.

In the vibrating element according to the embodiment of the disclosure, as described above, by adjusting any of an inclination with respect to the holding member, a fixing position with respect to the holding member in a fixing plane along the front surface of the substrate, and a fixing orientation in the fixing plane, the fixing part is fixed to the holding member in a state in which each of the pair of support beam parts applies tension to the torsion beam part in a direction away from the movable part in the first direction in which the torsion beam part extends. Accordingly, by adjusting the method of fixing the fixing part with respect to the holding member, without providing a member on the support beam part by film formation to apply tension to the torsion beam part, tension can be applied (imparted) to the torsion beam part in a direction away from the movable part in the first direction. As a result, since tension can be applied to the torsion beam part without film formation on the torsion beam part, compared to the configuration in which a member applying tension to the torsion beam part is formed by film formation which complicates the manufacturing process, it is possible to suppress displacement of the movable part while suppressing complication of the manufacturing process.

In the vibrating element according to the embodiment, by twisting in directions opposite to each other, the fixing parts may be fixed in a state in which the inclination with respect to the holding member is adjusted, or by bending the pair of support beam parts in directions opposite to each other, the fixing parts may be fixed in a state in which the fixing position with respect to the holding member in the fixing plane is adjusted. With this configuration, in the case in which the fixing parts are fixed in a state in which the inclination with respect to the holding member is adjusted by twisting the fixing parts in directions opposite to each other, since the support beam parts are twisted in directions opposite to each other by twisting the fixing parts in directions opposite to each other, tension can be easily applied to the torsion beam parts via the support beam parts in directions away from the movable part. Also, in the case in which the fixing parts are fixed in a state in which the fixing position with respect to the holding member in the fixing plane is adjusted by bending the pair of support beam parts in directions opposite to each other, by bending the pair of support beam parts in directions opposite to each other, tension can be easily applied to the torsion beam parts via the support beam parts in directions away from the movable part. As a result, since tension can be easily applied to the torsion beam parts via the support beam parts in directions away from the movable part, it is possible to easily suppress occurrence of displacement other than swinging in the movable part while suppressing complication of the manufacturing process.

In the above case, the fixing part may fixed to the holding member in a twisted state in which, of portions of the fixing part in the first direction, a first portion on a side close to the movable part rotates in a direction from a rear surface side toward a front surface side of the movable part, or in a twisted state in which, of the portions of the fixing part in the first direction, a second portion on a side far from the movable part rotates in a direction from the front surface side toward the rear surface side of the movable part. Or the fixing part may be fixed to the holding member in a state in which the pair of support beam parts is bent so that a distance between the second end parts of the pair of support beam parts is larger than a distance between the first end parts of the pair of support beam parts. With this configuration, by twisting the first portion of the fixing part in a direction from the rear surface side toward the front surface side of the movable part or twisting the second portion in a direction from the front surface side toward the rear surface side of the movable part, tension in a direction away from the movable part in the first direction can be easily and surely applied to the torsion beam part. Also, by bending the pair of support beam parts so that a distance between the second end parts is larger than a distance between the first end parts, tension in a direction away from the movable part in the first direction can be easily and surely applied to the torsion beam part. As a result, since tension can be easily and surely applied to the torsion beam part via the support beam part in a direction away from the movable part, it is possible to more easily suppress occurrence of displacement other than swinging in the movable part while suppressing complication of the manufacturing process.

In the configuration in which the fixing part is fixed to the holding member in a twisted state or the fixing part is fixed to the holding member in a state in which the pair of support beam parts is bent, in a case where the fixing part is fixed to the holding member in a twisted state, the holding member may include an abutting part having an abutting surface which abuts the fixing part, and the abutting surface may be inclined so that a first abutting portion on a side close to the movable part in the first direction and a second abutting portion on a side far from the movable part in the first direction are located at positions different from each other in a second direction orthogonal to a front surface of the movable part. With this configuration, since the abutting surface can be easily inclined, by fixing the fixing part in an abutting state with the abutting surface, the twisting directions of the fixing parts can be easily configured as opposite directions. As a result, the fixing parts can be easily fixed to the holding member in a state in which the pair of support beam parts applies tension to the torsion beam parts in directions away from the movable part in the first direction.

In the above case, the abutting part may include an abutting member provided separately from the holding member, and the vibrating element further includes a fixing angle adjustment mechanism capable of adjusting an inclination angle of the abutting surface. With this configuration, by adjusting the inclination angle of the abutting surface, the inclination of the fixing part with respect to the holding member can be easily adjusted. As a result, the magnitude of the tension to be applied to the torsion beam part can be easily adjusted.

In the configuration in which the fixing part is fixed to the holding member in a twisted state or the fixing part is fixed to the holding member in a state in which the pair of support beam parts is bent, in a case where the fixing part is fixed to the holding member in a twisted state, the holding member may include an abutting part having an abutting surface which abuts the fixing part, and the vibrating element may further include a first spacer member provided at a position between the fixing part and the abutting surface in a second direction orthogonal to a front surface of the movable part. The fixing part may be fixed to the holding member in a state in which the inclination with respect to the holding member is adjusted by the first spacer member. With this configuration, it is possible to incline the fixing part with respect to the holding member by the first spacer member. As a result, the fixing part can be easily inclined with respect to the holding member without inclining the abutting surface.

In the configuration in which the fixing part is fixed to the holding member in a twisted state, the fixing part may be fixed to the holding member in a state in which the support beam part is twisted in a direction in which, of the torsion beam part, an end part connected to the movable part protrudes toward the front surface side of the movable part. With this configuration, in addition to the tension applied to the torsion beam part in a direction away from the movable part in the first direction, tension can also be applied to the front surface side of the movable part. As a result, for example, in the case where the front surface of the movable part is arranged upward in the vertical direction, since the tension applied to the front surface side of the movable part makes it possible to suppress sinking of the movable part resulting from the weight of the movable part itself, it is possible to further suppress displacement of the movable part other than swinging.

In the configuration in which the fixing part is fixed to the holding member in a twisted state, the vibrating element may further include a second spacer member arranged between the abutting part and the holding member in a direction in which the support beam part extends. The abutting part may be configured to be capable of adjusting the fixing position of the fixing part in a direction in which the support beam part extends by the second spacer member. With this configuration, since it is possible to adjust the fixing position of the fixing part in the direction in which the support beam part extends, it is possible to reduce an error in the fixing position of the fixing part during assembly even if there are manufacturing tolerances that occur in the substrate and the holding member. As a result, the vibrating element can be easily manufactured.

In the configuration in which the fixing part is fixed to the holding member in a twisted state or the fixing part is fixed to the holding member in a state in which the pair of support beam parts is bent, in a case of fixing to the holding member in a state in which the support beam part is bent, the fixing part may have a fixing position adjustment part which penetrates the fixing part in a thickness direction of the fixing part and extends along the first direction, and the fixing part may be fixed to the holding member in a state in which position adjustment in the fixing plane is performed by a fixing member inserted through the fixing position adjustment part. With this configuration, since the fixing position adjustment part extends in the first direction, the distance between the second end parts in the first direction when the fixing part is fixed to the holding member can be easily adjusted. As a result, the magnitude of the tension to be applied to the torsion beam part via the support beam part can be easily adjusted.

In the configuration in which the fixing part is fixed to the holding member in a twisted state or the fixing part is fixed to the holding member in a state in which the pair of support beam parts is bent, the vibrating element may include a first screw member which fixes one of the pair of fixing parts and a second screw member which fixes another of the pair of fixing parts. The holding member may be provided with a first screw hole to which the first screw member is fastened and a second screw hole to which the second screw member is fastened. The first screw hole and the second screw hole may be configured so that each of a force applied to one of the pair of support beam parts via the one of the fixing parts when the first screw member is tightened, and a force applied to another of the pair of support beam parts via the another of the fixing parts when the second screw member is tightened is directed in a direction away from the movable part in the first direction.

With this configuration, by fixing the pair of fixing parts respectively by the first screw member and the second screw member, since a force in a direction away from the movable part in the first direction is applied to each of the pair of support beam parts, the position of each of the pair of support beam parts can be easily changed to a position away from the movable part in the first direction. As a result, tension in a direction away from the movable part in the first direction can be easily applied to the torsion beam part via the support beam part. Further, by adjusting the tightening condition (i.e., the angle of the screw member) of the first screw member and the second screw member, the direction in which the fixing part is fixed in the fixing plane can be easily adjusted. As a result, since the position of the pair of support beam parts in the fixing plane can be easily changed by adjusting the direction in which the fixing part is fixed in the fixing plane, the tension applied to the torsion beam part via the support beam part can be easily adjusted.

DESCRIPTION OF THE EMBODIMENTS

According to the disclosure, it is possible to provide a vibrating element and an optical scanning device which can suppress occurrence of displacement other than swinging in a movable part while suppressing complication of the manufacturing process.

Hereinafter, embodiments of the disclosure will be described with reference to the drawings.

First Embodiment

Referring to FIG. 1 to FIG. 7, the configuration of a vibrating element 1 according to a first embodiment and the configuration of an optical scanning device 100 including the vibrating element 1 will be described.

(Configuration of Optical Scanning Device)

Figure 1:
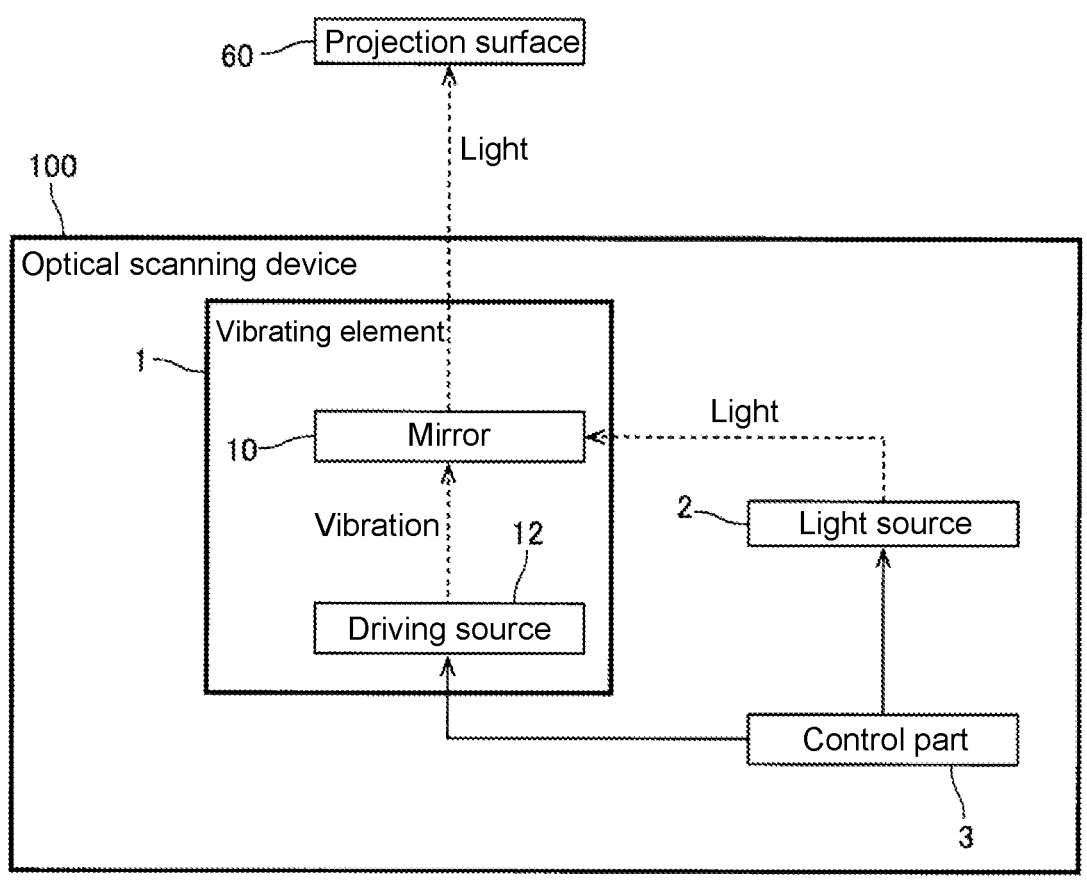
FIG. 1 is a block diagram showing an overall configuration of an optical scanning device according to a first embodiment.

As shown in FIG. 1, the optical scanning device 100 according to this embodiment includes a vibrating element 1, a light source 2, and a control part 3. The optical scanning device 100 is configured to irradiate light to a projection surface 60.

The vibrating element 1 is configured to swing a movable part 14 (see FIG. 2) by a plate wave generated by a driving source 12 and meanwhile reflect light irradiated from the light source 2 by a mirror 10 provided on the movable part 14 to project the light to the projection surface 60. The detailed configuration of the vibrating element 1 will be described later.

The light source 2 is configured to output light. Specifically, the light source 2 is configured to irradiate light to the mirror 10 included in the vibrating element 1 via a lens or the like. The light source 2 includes, for example, a light emitting diode (LED), a laser diode (LD), and the like. In this embodiment, the light source 2 is an LED.

The control part 3 is configured to control the irradiation of light of the light source 2. Further, the control part 3 is configured to control the vibrating element 1. The control part 3 includes a processor such as a central processing unit (CPU), for example.

(Configuration of Vibrating Element)

Figure 2:
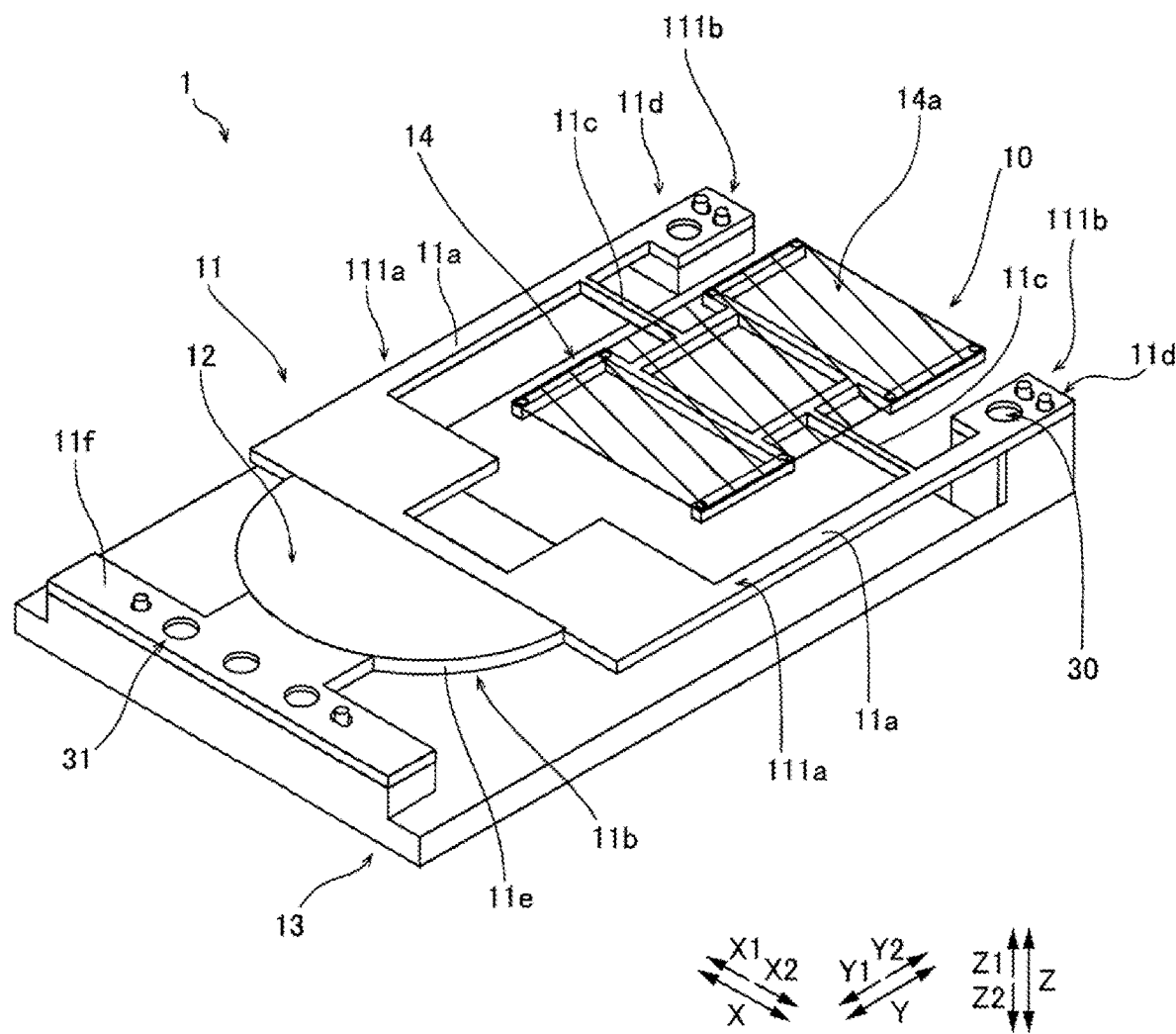
FIG. 2 is a perspective view of a vibrating element according to the first embodiment.

As shown in FIG. 2, the vibrating element 1 includes a movable part 14, a substrate 11, a driving source 12, and a holding member 13. In the specification, a direction orthogonal to a front surface 14a of the movable part 14 is the Z direction, the upward direction is the Z1 direction, and the downward direction is the Z2 direction. Further, two directions orthogonal to each other in a plane orthogonal to the Z direction are respectively the X direction and the Y direction. In the X direction, one side is the X1 direction and the other side is the X2 direction. Further, in the Y direction, one side is the Y1 direction and the other side is the Y2 direction. The X direction is an example of the "first direction" in the claims. The Z direction is an example of the "second direction" in the claims.

The substrate 11 includes a pair of support beam parts 11a, a support part 11b, and torsion beam parts 11c. Further, the substrate 11 includes the movable part 14 on which the mirror 10 is arranged. The substrate 11 is made of, for example, a flat plate-shaped stainless steel material.

The pair of support beam parts 11a each has a first end part 111a and a second end part 111b. Each of the first end parts 111a is supported by the support part 11b. Further, in the first embodiment, the second end part 111b of each of the pair of support beam parts 11a is provided with a fixing part 11d fixed to the holding member 13. The fixing part 11d is a portion of the pair of support beam parts 11a.

In the example shown in FIG. 2, the fixing part 11d is formed by increasing the width in the X direction of the pair of support beam parts 11a on the second end part 111b side. Further, the fixing part 11d is held to the holding member 13 by screwing, for example. Therefore, the fixing part 11d is provided with a through hole 30 penetrating in the Z direction.

The support part 11b is configured to support the first end part 111a of each of the pair of support beam parts 11a. Further, the support part 11b is provided with the driving source 12. Specifically, the support part 11b has a driving source support part 11e which supports the driving source 12, and the driving source 12 is arranged on the driving source support part 11e. The driving source support part 11e has a semicircular shape similar to the driving source 12. Further, in the extending direction (Y direction) of the support beam part 11a, the support part 11b has a holding part 11f provided at an end part on a side which does not support the pair of support beam parts 11a. The support part 11b is held to the holding member 13 by screwing, for example. Therefore, the holding part 11f is provided with a through hole 31 penetrating in the Z direction.

The torsion beam part 11c swingably supports the movable part 14. The torsion beam part 11c extends in the first direction (X direction). Further, the torsion beam part 11c has a columnar shape. Further, a pair of torsion beam parts 11c is provided. One of the pair of torsion beam parts 11c is connected to one of the pair of support beam parts 11a, and the other of the torsion beam parts 11c is connected to the other of the support beam parts 11a. Further, each of the pair of torsion beam parts 11c is connected to the movable part 14.

The movable part 14 has a rectangular shape. Further, the movable part 14 is integrally formed with the substrate 11. Further, the movable part 14 is connected to the pair of support beam parts 11a via the torsion beam parts 11c. In this embodiment, the mirror 10 is provided on the front surface 14a side of the movable part 14. In the example shown in FIG. 2, the mirror 10 is shown with hatching for convenience of illustration.

The driving source 12 is configured to generate a plate wave which swings the movable part 14. The driving source 12 includes, for example, a piezoelectric element. The piezoelectric element includes, for example, lead zirconate titanate (PZT) and electrodes for applying a voltage to the PZT. In the example shown in FIG. 2, a PZT having a semicircular shape is provided on the substrate 11 as the driving source 12.

The holding member 13 is configured to hold the support part 11b. As shown in FIG. 2, the holding member 13 holds the holding part 11f which is provided at an end part of the support part 11b on a side in the Y direction which does not support the pair of support beam parts 11a. Further, the holding member 13 is configured to hold each of the pair of support beam parts 11a. As shown in FIG. 2, the holding member 13 is configured to hold the fixing parts 11d in the pair of support beam parts 11a. Details of the configuration in which the holding member 13 holds the fixing part 11d will be described later.

(First Portion and Second Portion)

Figure 3:
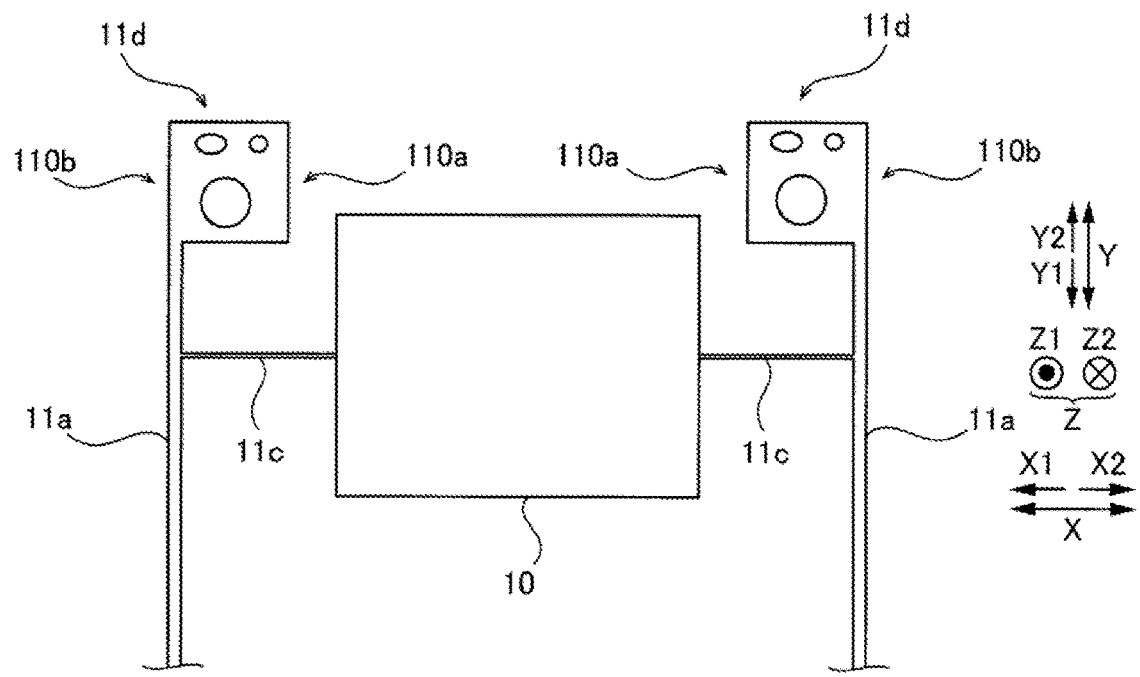
FIG. 3 is a plan view showing a pair of support beam parts, a torsion beam part, and a mirror according to the first embodiment.

As shown in FIG. 3, the fixing part 11d includes a first portion 110a and a second portion 110b. In the fixing part 11d, the portion close to the movable part 14 in the first direction (X direction) is the first portion 110a. Further, in the fixing part 11d, the portion far from the movable part 14 in the first direction is the second portion 110b.

By adjusting any of an inclination with respect to the holding member 13, a fixing position with respect to the holding member 13 in a fixing plane along the front surface of the substrate 11, and a fixing orientation in the fixing plane, the fixing part 11d is fixed to the holding member 13 in a state in which each of the pair of support beam parts 11a applies tension to the torsion beam part 11c in a direction away from the movable part 14 in the first direction in which the torsion beam part 11c extends. The fixing orientation of the fixing part 11d in the fixing plane refers to the rotation direction of the fixing part 11d in the fixing plane. In the first embodiment, by adjusting the inclination with respect to the holding member 13, the fixing part 11d is fixed to the holding member 13 in a state in which each of the pair of support beam parts 11a applies tension to the torsion beam part 11c in a direction away from the movable part 14 in the first direction in which the torsion beam part 11c extends.

(Inclination of Fixing Part)

Figure 4:
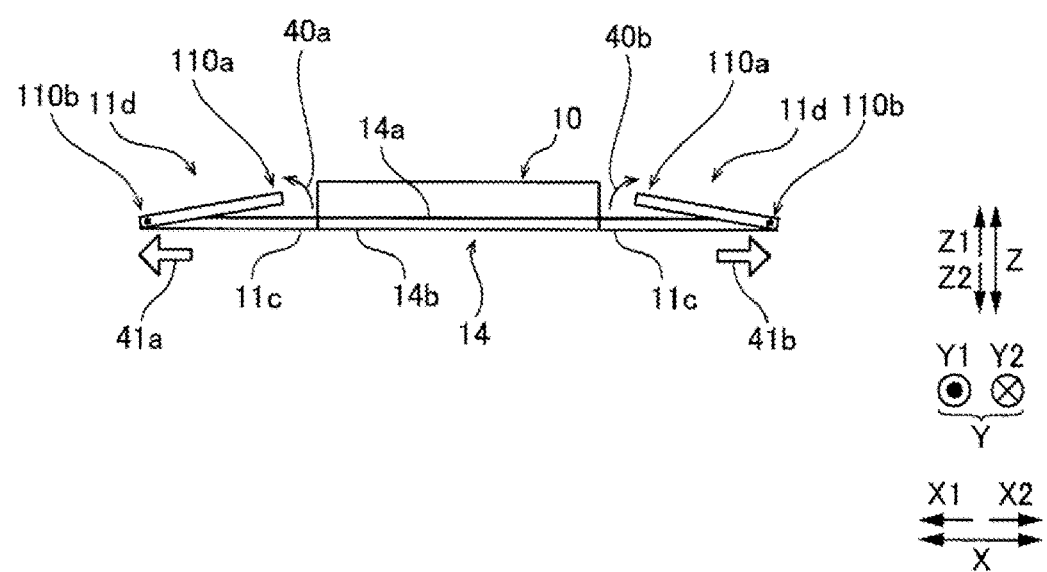
FIG. 4 is a schematic view of a substrate according to the first embodiment as viewed from a direction in which the support beam part extends.

As shown in FIG. 4, the fixing parts 11d are fixed in a state in which the inclination with respect to the holding member 13 is adjusted by twisting in directions opposite to each other. Specifically, the fixing part 11d is fixed to the holding member 13 in a twisted state in which the first portion 110a in the fixing part 11d on the side close to the movable part 14 in the first direction (X direction) rotates in a direction (Z1 direction) from a rear surface 14b side of the movable part 14 toward the front surface 14a side, or in a twisted state in which the second portion 110b in the fixing part 11d on the side far from the movable part 14 in the first direction rotates in a direction (Z2 direction) from the front surface 14a side toward the rear surface 14b side of the movable part 14. In the example shown in FIG. 4, the fixing part 11d is fixed to the holding member 13 in a twisted state in which the first portion 110a in the fixing part 11d rotates in a direction from the rear surface 14b side toward the front surface 14a side of the movable part 14. In other words, the fixing part 11d is fixed to the holding member 13 in a twisted state of rotating on the Y direction.

Specifically, the fixing part 11d on the X1 direction side is fixed to the holding member 13 in a state in which the first portion 110a on the X1 direction side is twisted in a direction along arrow 40*a*. As a result, the support beam part 11*a* (see FIG. 3) on the X1 direction side is twisted in a direction along arrow 40*a*. Therefore, since a force in a direction indicated by arrow 41*a* is generated with respect to the support beam part 11*a* on the X1 direction side, tension is applied to the torsion beam part 11*c* in a direction (X1 direction) away from the movable part 14 in the first direction.

Further, the fixing part 11*d* on the X2 direction side is fixed to the holding member 13 in a state in which the first portion 110*a* on the X2 direction side is twisted in a direction along arrow 40*b*. As a result, the support beam part 11*a* (see FIG. 3) on the X2 direction side is twisted in a direction along arrow 40*b*. Therefore, since a force in a direction indicated by arrow 41*b* is generated with respect to the support beam part 11*a* on the X2 direction side, tension is applied to the torsion beam part 11*c* in a direction (X2 direction) away from the movable part 14 in the first direction.

Further, in the first embodiment, the fixing part 11*d* is fixed to the holding member 13 in a state in which the support beam part 11*a* is twisted in a direction in which, of the torsion beam part 11*c*, an end part connected to the movable part 14 protrudes toward the front surface 14*a* side of the movable part 14. In the example shown in FIG. 4, the direction of protrusion toward the front surface 14*a* side is the Z1 direction.

(Structure of Abutting Part)

Next, the configuration of an abutting part 15 according to the first embodiment will be described with reference to FIG. 5 and FIG. 6.

Figure 5:
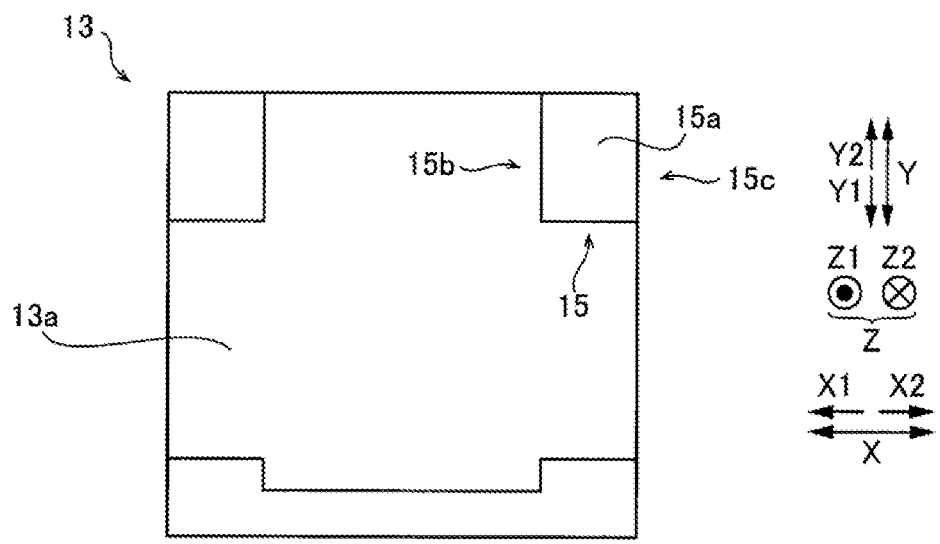
FIG. 5 is a plan view of a holding member according to the first embodiment.

As shown in FIG. 5, the holding member 13 includes a base 13*a* and an abutting part 15. The abutting part 15 is formed to protrude from the base 13*a* toward the front surface 14*a* side (Z1 direction side) of the movable part 14. The abutting part 15 is provided at an end part of the holding member 13 on the Y2 direction side. Further, the abutting part 15 is provided at two positions, i.e., on the X1 direction side and the X2 direction side, of the end part of the holding member 13 on the Y2 direction side. In the example shown in FIG. 5, the abutting part 15 is integrally formed with the holding member 13. Further, the abutting part 15 has an abutting surface 15*a* which abuts the fixing part 11*d*. Further, the abutting surface 15*a* includes a first abutting portion 15*b* and a second abutting portion 15*c*. In the abutting surface 15*a*, the portion close to the movable part 14 in the first direction (X direction) is the first abutting portion 15*b*. Further, in the abutting surface 15*a*, the portion far from the movable part 14 in the first direction is the second abutting portion 15*c*.

Figure 6:
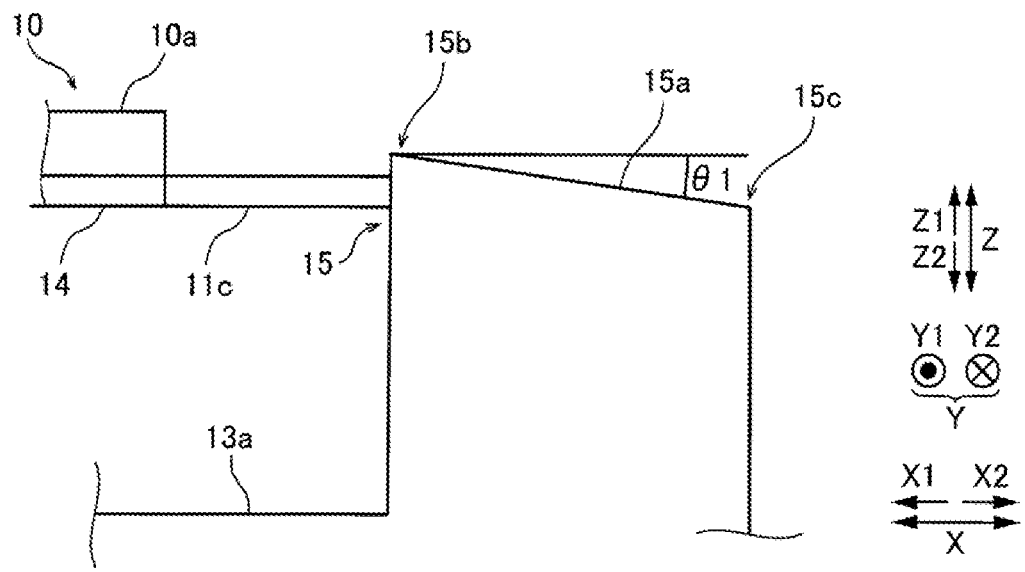
FIG. 6 is a schematic view of the holding member according to the first embodiment as viewed from the direction in which the support beam part extends.

As shown in FIG. 6, the abutting surface 15*a* is inclined. Specifically, the abutting surface 15*a* is inclined so that the first abutting portion 15*b* and the second abutting portion 15*c* are located at positions different from each other in the second direction (Z direction) orthogonal to the front surface 14*a* of the movable part 14. In the first embodiment, the abutting surface 15*a* is inclined so that the first abutting portion 15*b* is located on the Z1 direction side with respect to the second abutting portion 15*c*. Further, in the first embodiment, the abutting surface 15*a* is inclined so that the inclination angle is an angle θ1. The inclination angle is an angle between the abutting surface 15*a* and a plane along the front surface 14*a* of the movable part 14.

(Inclination of Fixing Part with Respect to Holding Member)

Figure 7:
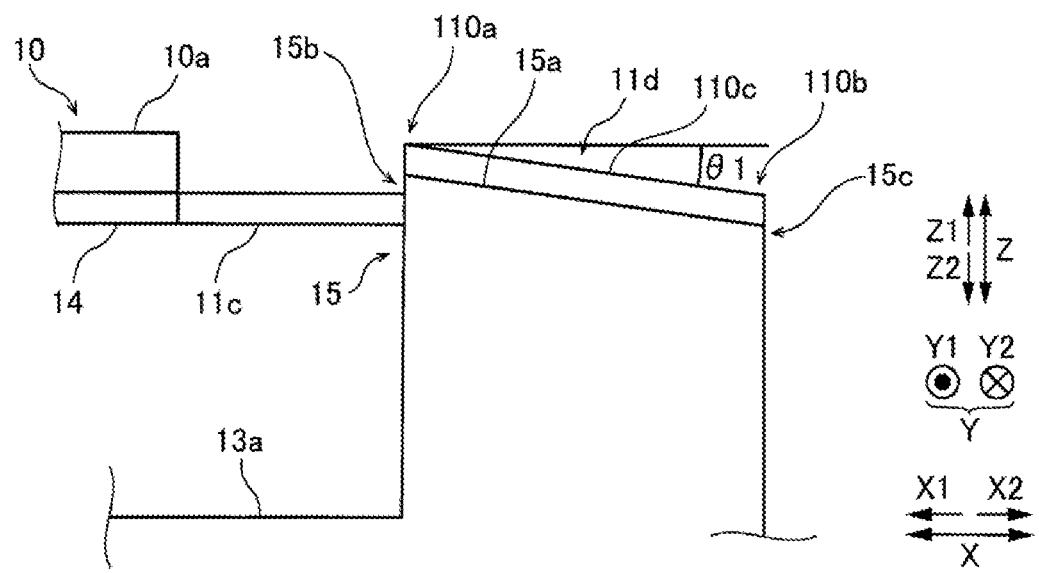
FIG. 7 is a schematic view showing a configuration in which a fixing part is fixed to an abutting part according to the first embodiment.

As shown in FIG. 7, the fixing part 11*d* is fixed in an inclined state with respect to the base 13*a*. Specifically, the fixing part 11*d* is fixed in an abutting state with the abutting surface 15*a*.

Since the abutting surface 15*a* is inclined so that the first abutting portion 15*b* is located on the Z1 direction side with respect to the second abutting portion 15*c*, by fixing the fixing part 11*d* in an abutting state with the abutting surface 15*a*, the first portion 110*a* is inclined to be located on the Z1 direction side with respect to the second portion 110*b*. In the first embodiment, since the abutting surface 15*a* is inclined at the angle θ1, the fixing part 11*d* is also inclined at the angle θ1. The inclination angle of the fixing part 11*d* is an angle between a plane along the front surface 14*a* the movable part 14 and a front surface 110*c* of the fixing part 11*d*.

Effects of First Embodiment

In the first embodiment, the following effects can be obtained.

In the first embodiment, as described above, the vibrating element 1 includes the movable part 14, the substrate 11 made of metal, the driving source 12, and the holding member 13. The substrate 11 includes the pair of support beam parts 11*a* each having the first end part 111*a* and the second end part 111*b*, the support part 11*b* supporting the first end part 111*a* of each of the pair of support beam parts 11*a*, and the torsion beam part 11*c* which swingably supports the movable part 14. The driving source 12 is provided on the support part 11*b* and generates a plate wave which swings the movable part 14. The holding member 13 holds the substrate 11. The second end part 111*b* of each of the pair of support beam parts 11*a* is provided with the fixing part 11*d* fixed to the holding member 13. By adjusting the inclination with respect to the holding member 13, the fixing part 11*d* is fixed to the holding member 13 in a state in which each of the pair of support beam parts 11*a* applies tension to the torsion beam part 11*c* in a direction away from the movable part 14 in the first direction in which the torsion beam part 11*c* extends.

Accordingly, by adjusting the method of fixing the fixing part 11*d* with respect to the holding member 13, without providing a member on the support beam part 11*a* by film formation to apply tension to the torsion beam part 11*c*, tension can be applied (imparted) to the torsion beam part 11*c* in a direction away from the movable part 14 in the first direction. As a result, since tension can be applied to the torsion beam part without film formation on the torsion beam part 11*c*, compared to the configuration in which a member applying tension to the torsion beam part 11*c* is formed by film formation which complicates the manufacturing process, it is possible to suppress occurrence of displacement other than swinging in the movable part 14 while suppressing complication of the manufacturing process.

Further, in the first embodiment, as described above, the fixing parts 11*d* are fixed in a state in which the inclination with respect to the holding member 13 is adjusted by twisting in directions opposite to each other, or are fixed in a state in which the fixing position with respect to the holding member 13 in the fixing plane is adjusted by bending the pair of support beam parts 11*a* in directions opposite to each other. Accordingly, since the support beam parts 11*a* are twisted in directions opposite to each other by twisting the fixing parts 11d in directions opposite to each other, tension can be easily applied to the torsion beam parts 11c via the support beam parts 11a in directions away from the movable part 14. As a result, since tension can be easily applied to the torsion beam parts 11c via the support beam parts 11a in directions away from the movable part 14, it is possible to easily suppress occurrence of displacement other than swinging in the movable part 14 while suppressing complication of the manufacturing process.

Further, in the first embodiment, as described above, the fixing part 11d is fixed to the holding member 13 in a twisted state in which the first portion 110a in the fixing part 11d on the side close to the movable part 14 in the first direction (X direction) rotates in a direction (Z1 direction) from the rear surface 14b side toward the front surface 14a side of the movable part 14. Accordingly, by twisting the first portion 110a of the fixing part 11d in a direction from the rear surface 14b side toward the front surface 14a side of the movable part 14, tension in a direction away from the movable part 14 in the first direction can be easily and surely applied to the torsion beam part 11c. As a result, since tension can be easily and surely applied to the torsion beam part 11c via the support beam part 11a in a direction away from the movable part 14, it is possible to more easily suppress occurrence of displacement other than swinging in the movable part 14 while suppressing complication of the manufacturing process.

Further, in the first embodiment, as described above, in the case where the fixing part 11d is fixed to the holding member 13 in a twisted state, the holding member 13 includes the abutting part 15 having the abutting surface 15a which abuts the fixing part 11d, and the abutting surface 15a is inclined so that the first abutting portion 15b on the side close to the movable part 14 in the first direction (X direction) and the second abutting portion 15c on the side far from the movable part 14 in the first direction are located at positions different from each other in the second direction (Z direction) orthogonal to the front surface 14a of the movable part 14. Accordingly, since the abutting surface 15a can be easily inclined, by fixing the fixing part 11d in an abutting state with the abutting surface 15a, the twisting directions of the fixing parts 11d can be easily configured as opposite directions. As a result, the fixing parts 11d can be easily fixed to the holding member 13 in a state in which the pair of support beam parts 11a applies tension to the torsion beam parts 11c in directions away from the movable part 14 in the first direction.

Further, in the first embodiment, as described above, the fixing part 11d is fixed to the holding member 13 in a state in which the support beam part 11a is twisted in a direction in which, of the torsion beam part 11c, an end part connected to the movable part 14 protrudes toward the front surface 14a side of the movable part 14. Accordingly, in addition to the tension applied to the torsion beam part 11c in a direction away from the movable part 14 in the first direction, tension can also be applied to the front surface 14a side of the movable part 14. As a result, for example, in the case where the front surface 14a of the movable part 14 is arranged upward in the vertical direction, since the tension applied to the front surface 14a side of the movable part 14 makes it possible to suppress sinking of the movable part 14 resulting from the weight of the movable part 14 itself, it is possible to further suppress displacement of the movable part 14 other than swinging.

Second Embodiment

A second embodiment will be described with reference to FIG. 8 and FIG. 9. A vibrating element 101 according to the second embodiment (see FIG. 8) is different from the vibrating element 1 according to the first embodiment in that a holding member 130 is included in place of the holding member 13. In the figures, the same reference numerals are given to the parts having the same configurations as those of the first embodiment.

Figure 8:
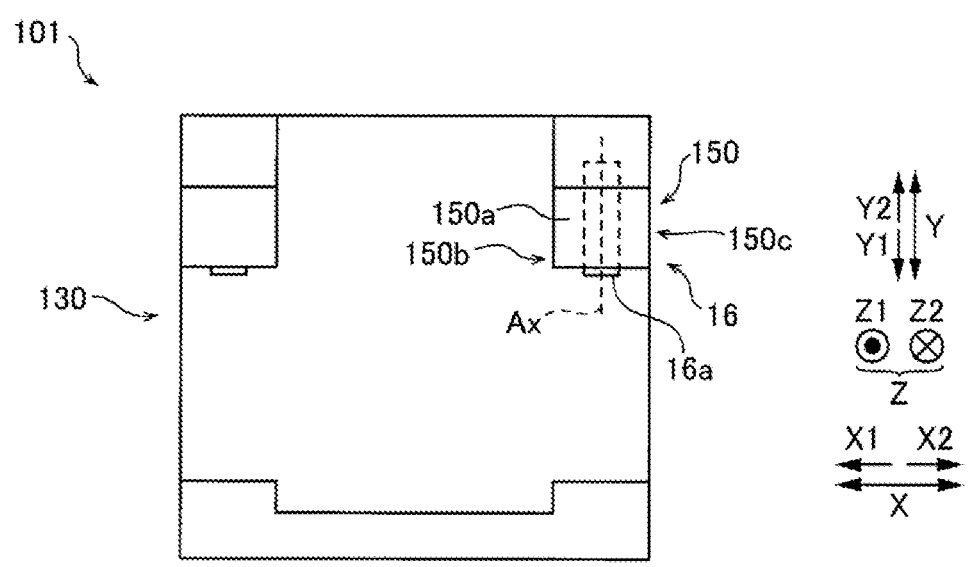
FIG. 8 is a plan view showing a fixing angle adjustment mechanism and a holding member according to a second embodiment.

As shown in FIG. 8, the vibrating element 101 according to the second embodiment includes the holding member 130. The holding member 130 includes an abutting member 150 provided separately from the holding member 130 in place of the abutting part 15 according to the first embodiment. The abutting member 150 is a member made of metal or resin and having a columnar shape. In the second embodiment, the abutting member 150 is made of metal. The abutting member 150 has an abutting surface 150a which abuts the fixing part 11d.

Further, in the second embodiment, the vibrating element 101 includes a fixing angle adjustment mechanism 16 capable of adjusting the inclination angle of the abutting surface 150a. As shown in FIG. 8, in the second embodiment, a total of two sets of the abutting member 150 and the fixing angle adjustment mechanism 16 are provided on the Y2 direction side of the holding member 130, with one set provided on the X1 direction side and another set provided on the X2 direction side.

The fixing angle adjustment mechanism 16 includes a screw member 16a. The fixing angle adjustment mechanism 16 is configured so that the abutting member 150 can be rotated in a rotation direction around an axis Ax by loosening the screw member 16a. Further, the fixing angle adjustment mechanism 16 is configured so that the inclination angle of the abutting surface 150a can be fixed by rotating the abutting member 150 in the rotation direction around the axis Ax and then tightening the screw member 16a.

Figure 9:
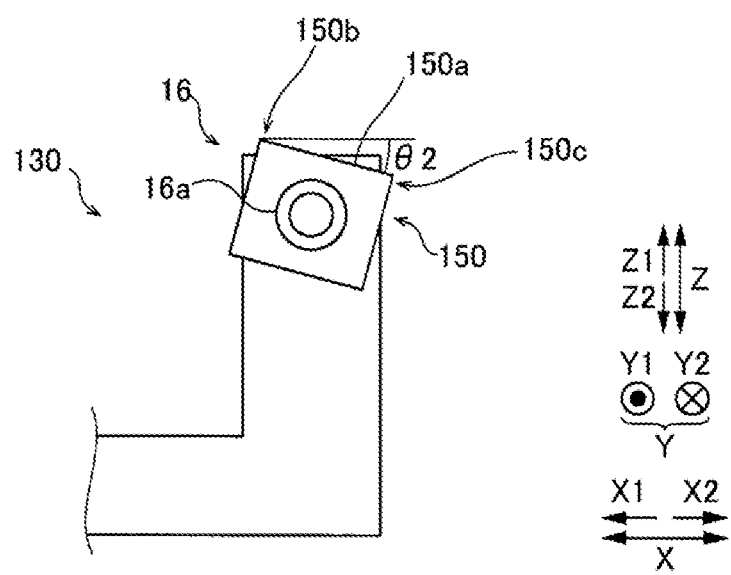
FIG. 9 is a perspective view showing a configuration for adjusting an inclination angle of an abutting surface by the fixing angle adjustment mechanism according to the second embodiment.

FIG. 9 is a schematic view of the abutting member 150 as viewed from the Y2 direction side. As shown in FIG. 9, in the second embodiment, the abutting member 150 is fixed in a state of being inclined at an angle θ2 by the fixing angle adjustment mechanism 16. Specifically, the abutting surface 150a is inclined so that a first abutting portion 150b is located on the Z1 direction side with respect to a second abutting portion 150c. Although the example shown in FIG. 9 shows the abutting member 150 and the fixing angle adjustment mechanism 16 on the X2 direction side, the abutting member 150 and the fixing angle adjustment mechanism 16 on the X1 direction side have the same configurations.

The other configurations of the vibrating element 101 according to the second embodiment are the same as those of the first embodiment.

Effect of Second Embodiment

In the second embodiment, as described above, the abutting part includes the abutting member 150 provided separately from the holding member 130 and further includes the fixing angle adjustment mechanism 16 capable of adjusting the inclination angle of the abutting surface 150a. Accordingly, by adjusting the inclination angle of the abutting surface 150a, the inclination of the fixing part 11d with respect to the holding member 130 can be easily adjusted. As a result, the magnitude of the tension to be applied to the torsion beam part 11c can be easily adjusted.

The other effects of the second embodiment are the same as those of the first embodiment.

Third Embodiment

A third embodiment will be described with reference to FIG. 10 and FIG. 11. A vibrating element 201 (see FIG. 10)

according to the third embodiment is different from the vibrating element 1 according to the first embodiment in that a holding member 230 is included in place of the holding member 13, and a first spacer member 17 is further included. In the figures, the same reference numerals are given to the parts having the same configurations as those of the first embodiment.

Figure 10:
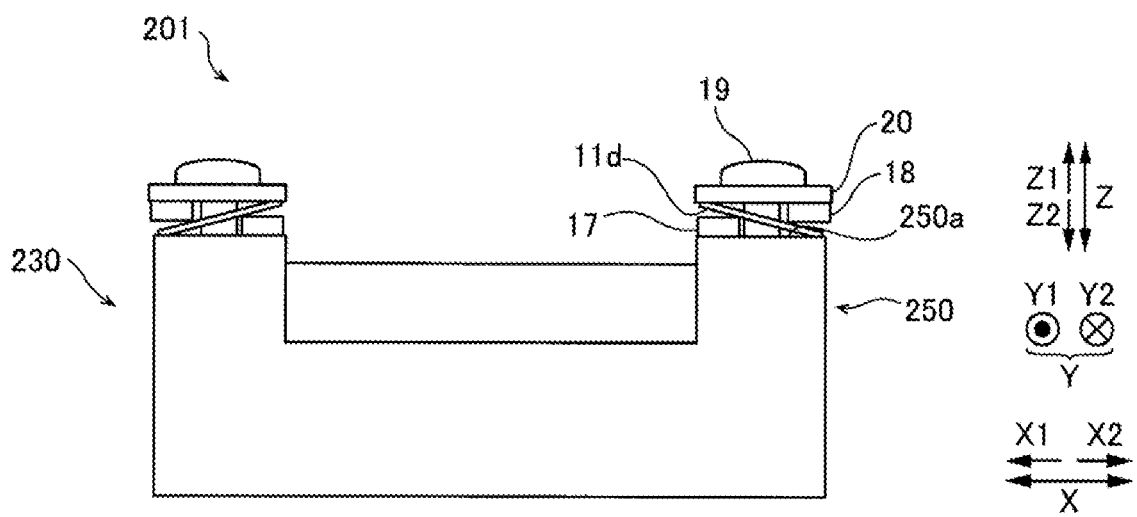
FIG. 10 is a schematic view showing a configuration for fixing a fixing part according to a third embodiment.

As shown in FIG. 10, the vibrating element 201 includes a first spacer member 17, an auxiliary spacer member 18, a screw member 19, a washer member 20, and a holding member 230. The holding member 230 includes an abutting part 250. The abutting part 250 has an abutting surface 250a. Unlike the abutting part 15 according to the first embodiment in which the abutting surface 15a is inclined, the abutting surface 250a according to the third embodiment is not inclined.

Figure 11:
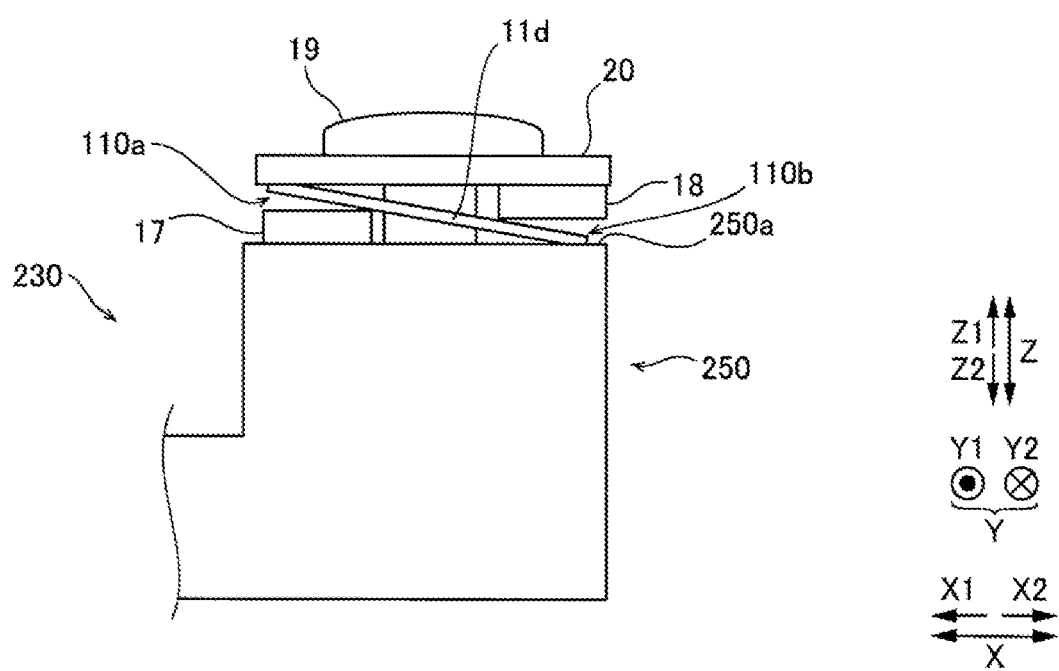
FIG. 11 is a schematic enlarged view of a part of FIG. 10.

Of the abutting parts 250 on the X1 direction side and the X2 direction side, FIG. 11 is a schematic enlarged view showing the abutting part 250 on the X2 direction side. As shown in FIG. 11, the first spacer member 17 is provided at a position between the fixing part 11d and the abutting surface 250a in the second direction (Z direction) orthogonal to the front surface 14a of the movable part 14. In the example shown in FIG. 11, the first spacer member 17 is provided on a side (X1 direction side) close to the movable part 14 in the first direction (X direction).

Further, the auxiliary spacer member 18 is provided on a side opposite to the first spacer member 17 in the first direction. In the second direction (Z direction), the auxiliary spacer member 18 abuts the fixing part 11d on the Z2 direction side and abuts the washer member 20 on the Z1 direction side.

The screw member 19 is configured to fix the fixing part 11d by fastening to a screw hole (not shown) provided in the abutting part 250. Specifically, the screw member 19 fixes the fixing part 11d to the holding member 230 in a state in which the fixing part 11d is inclined by the washer member 20, the first spacer member 17, and the auxiliary spacer member 18.

The washer member 20 is provided between the auxiliary spacer member 18 and the screw member 19 in the second direction (Z direction).

Of the abutting parts 250 on the X1 direction side and the X2 direction side, although the example shown in FIG. 11 shows the fixing part 11d fixed to the abutting part 250 on the X2 direction side, the fixing part 11d fixed to the abutting part 250 on the X1 direction side may have the same configuration as the fixing part 11d fixed to the abutting part 250 on the X2 direction side. In other words, the first spacer member 17 on the X1 direction side is provided on the X2 direction side and at a position between the fixing part 11d and the abutting surface 250a in the Z direction. Accordingly, the fixing part 11d is fixed to the holding member 230 (the abutting part 250) in an inclined state in which the first portion 110a and the second portion 110b of the fixing part 11d are located at positions different from each other in the second direction (Z direction). In the third embodiment, as in the first embodiment described above, the fixing part 11d is fixed to the holding member 230 in an inclined state in which the first portion 110a is located on the Z1 direction side with respect to the second portion 110b.

The other configurations of the vibrating element 201 according to the third embodiment are the same as those of the first embodiment.

Effect of Third Embodiment

In the third embodiment, as described above, in the case where the fixing part 11d is fixed to the holding member 230 in a twisted state, the holding member 230 includes the abutting part 250 having the abutting surface 250a which abuts the fixing part 11d, and further includes the first spacer member 17 provided at a position between the fixing part 11d and the abutting surface 250a in the second direction (Z direction) orthogonal to the front surface 14a of the movable part 14. The fixing part 11d is fixed to the holding member 230 in a state in which the inclination with respect to the holding member 230 is adjusted by the first spacer member 17. Accordingly, it is possible to incline the fixing part 11d with respect to the holding member 230 by the first spacer member 17. As a result, the fixing part 11d can be easily inclined with respect to the holding member 230 without inclining the abutting surface 250a.

The other effects of the third embodiment are the same as those of the first embodiment.

Fourth Embodiment

A fourth embodiment will be described with reference to FIG. 12. Unlike the first embodiment in which the fixing part 11d is fixed to the holding member 13 in a state in which the inclination of the fixing part 11d with respect to the holding member 13 is adjusted, in a vibrating element 301 according to the fourth embodiment, the fixing part 11d is fixed to the holding member 13 in a state in which a fixing position with respect to the holding member 13 in a fixing plane along the front surface of the substrate 11 is adjusted. In the figure, the same reference numerals are given to the parts having the same configurations as those of the first embodiment.

In the fourth embodiment, by adjusting the fixing position with respect to the holding member 13 in the fixing plane along the front surface of the substrate 11, the fixing part 11d is fixed to the holding member 13 in a state in which each of the pair of support beam parts 11a applies tension to the torsion beam part 11c in a direction away from the movable part 14 in the first direction in which the torsion beam part 11c extends. Specifically, the fixing part 11d is fixed to the holding member 13 in a state in which the pair of support beam parts 11a is bent so that a distance D2 between the second end parts 111b of the pair of support beam parts 11a is larger than a distance D1 between the first end parts 111a of the pair of support beam parts 11a.

Figure 12:
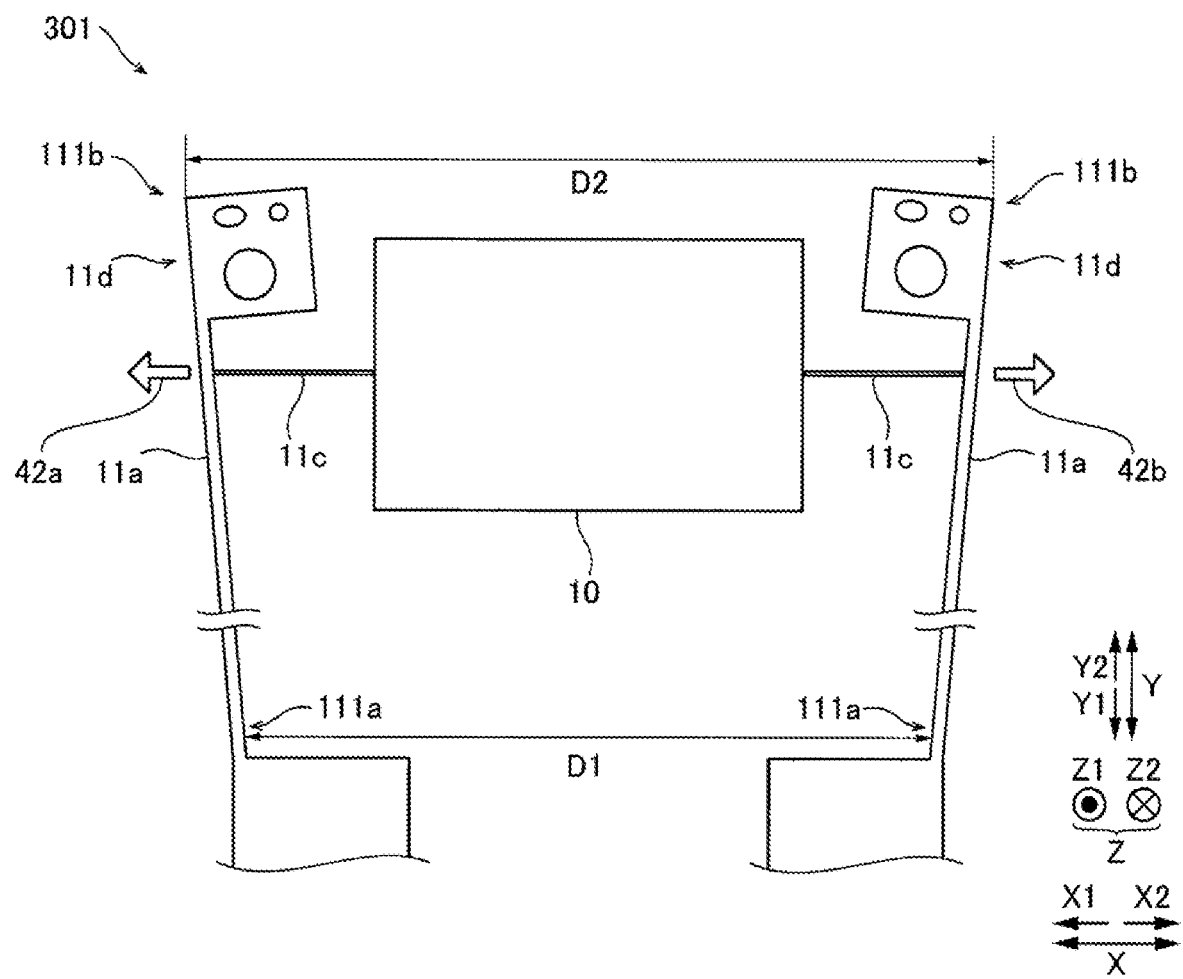
FIG. 12 is a schematic view showing a distance between first end parts and a distance between second end parts according to a fourth embodiment.

As shown in FIG. 12, in the fourth embodiment, since the fixing part 11d is fixed to the holding member 13 in a state in which the pair of support beam parts 11a is bent so that the distance D2 between the second end parts 111b of the pair of support beam parts 11a is larger than the distance D1 between the first end parts 111a of the pair of support beam parts 11a, each of the pair of support beam parts 11a is fixed in a state of being open to the outside. In the example shown in FIG. 12, for convenience of illustration, the difference between the distance D1 and the distance D2 is exaggerated and schematically shown.

Specifically, the support beam part 11a on the X1 direction side is opened in a direction indicated by arrow 42a. Therefore, tension in the direction of arrow 42a is applied to the torsion beam part 11c via the support beam part 11a on the X1 direction side. Further, the support beam part 11a on the X2 direction side is opened in a direction indicated by arrow 42b. Therefore, tension in the direction of arrow 42b is applied to the torsion beam part 11c via the support beam part 11a on the X2 direction side.

The other configurations of the vibrating element 301 according to the fourth embodiment are the same as those of the first embodiment.

Effect of the Fourth Embodiment

In the fourth embodiment, as described above, the vibrating element 301 includes the movable part 14 reflecting light, the substrate 11 made of metal, the driving source 12, and the holding member 13. The substrate 11 includes the pair of support beam parts 11a each having the first end part 111a and the second end part 111b, the support part 11b supporting the first end part 111a of each of the pair of support beam parts 11a, and the torsion beam part 11c which swingably supports the movable part 14. The driving source 12 is provided on the support part 11b and generates a plate wave which swings the movable part 14. The holding member 13 holds the substrate 11. The second end part 111b of each of the pair of support beam parts 11a is provided with the fixing part 11d fixed to the holding member 13. By adjusting the fixing position with respect to the holding member 13 in the fixing plane along the front surface of the substrate 11, the fixing part 11d is fixed to the holding member 13 in a state in which each of the pair of support beam parts 11a applies tension to the torsion beam part 11c in a direction away from the movable part 14 in the first direction in which the torsion beam part 11c extends. Accordingly, by bending the pair of support beam parts 11a in opposite directions, tension can be easily applied to the torsion beam part 11c via the support beam part 11a in a direction (first direction) away from the movable part 14. As a result, since tension can be easily applied to the torsion beam part 11c via the support beam part 11a in a direction away from the movable part 14, it is possible to easily suppress displacement of the movable part 14 while suppressing complication of the manufacturing process.

Further, in the fourth embodiment, as described above, by bending the pair of support beam parts 11a in directions opposite to each other, the fixing part 11d is fixed in a state in which the fixing position with respect to the holding member 13 in the fixing plane is adjusted. Accordingly, similar to the vibrating element 1 according to the first embodiment, since tension can be easily applied to the torsion beam part 11c via the support beam part 11a in a direction away from the movable part 14, it is possible to easily suppress displacement of the movable part 14 while suppressing complication of the manufacturing process.

Further, in the fourth embodiment, as described above, the fixing part 11d is fixed to the holding member 13 in a state in which the pair of support beam parts 11a is bent so that the distance D2 between the second end parts 111b of the pair of support beam parts 11a is larger than the distance D1 between the first end parts 111a of the pair of support beam parts 11a. Accordingly, similar to the vibrating element 1 according to the first embodiment, since tension can be easily and surely applied to the torsion beam part 11c via the support beam part 11a in a direction away from the movable part 14, it is possible to more easily suppress displacement of the movable part 14 while suppressing complication of the manufacturing process.

The other effects of the fourth embodiment are the same as those of the first embodiment.

Fifth Embodiment

A fifth embodiment will be described with reference to FIG. 13 and FIG. 14. A vibrating element 401 (see FIG. 13) according to the fifth embodiment is different from the vibrating element 1 according to the first embodiment in that a holding member 330 is included in place of the holding member 13. In the figures, the same reference numerals are given to the parts having the same configurations as those of the first embodiment.

In the fifth embodiment, the vibrating element 401 includes the holding member 330. Further, in the fifth embodiment, by adjusting a fixing orientation in the fixing plane, the fixing part 11d is fixed to the holding member 13 in a state in which each of the pair of support beam parts 11a applies tension to the torsion beam part 11c in a direction away from the movable part 14 in the first direction in which the torsion beam part 11c extends. Further, in the fifth embodiment, a first screw member 22a for fixing one of the pair of fixing parts 11d and a second screw member 22b for fixing the other of the pair of fixing parts 11d are included.

Figure 13:
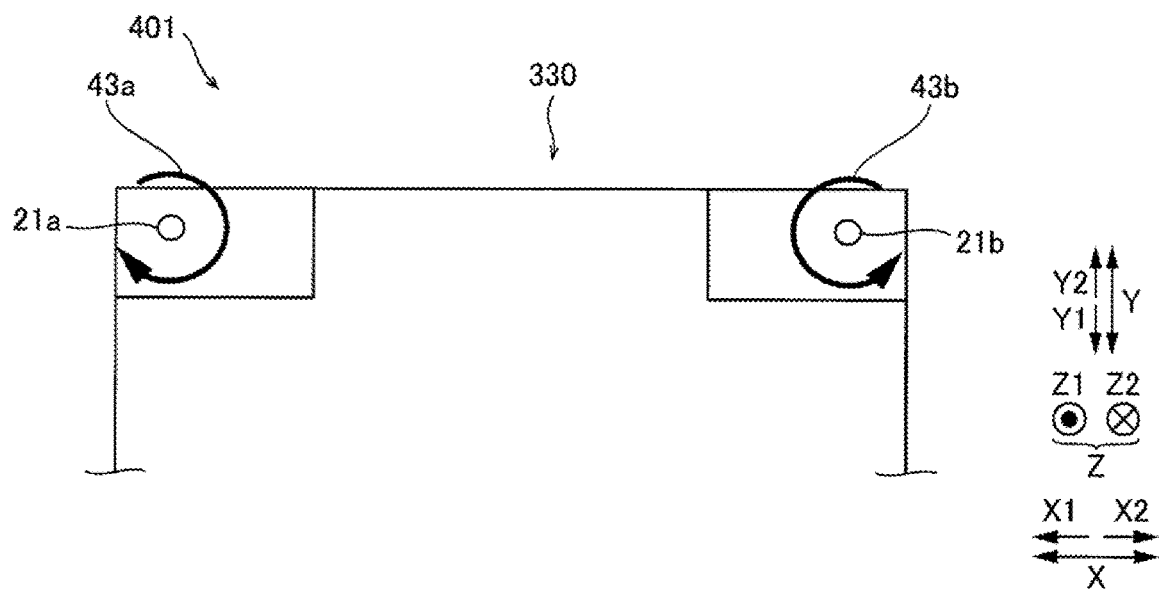
FIG. 13 is a schematic view showing a first screw hole and a second screw hole provided in the holding member according to a fifth embodiment.

As shown in FIG. 13, the holding member 330 is provided with a first screw hole 21a to which the first screw member 22a is fastened and a second screw hole 21b to which the second screw member 22b is fastened. The first screw hole 21a and the second screw hole 21b are configured so that each of a force applied to one of the pair of support beam parts 11a via one fixing part 11d when the first screw member 22a is tightened, and a force applied to the other of the pair of support beam parts 11a via the other fixing part 11d when the second screw member 22b is tightened is directed in directions away from the movable part 14 in the first direction (X direction). In the example shown in FIG. 13, the first screw hole 21a and the second screw hole 21b are configured so that the tightening direction of the first screw member 22a and the tightening direction of the second screw member 22b are different from each other. Specifically, the first screw hole 21a is formed with a screw hole in a direction indicated by arrow 43a. The direction indicated by arrow 43a is a clockwise direction when viewed from the front surface 14a (see FIG. 2) side (Z1 direction side) of the movable part 14. Further, the second screw hole 21b is formed with a screw hole in a direction indicated by arrow 43b. The direction indicated by arrow 43b is a counterclockwise direction when viewed from the front surface 14a (see FIG. 2) side (Z1 direction side) of the movable part 14 toward the Z2 direction.

Figure 14:
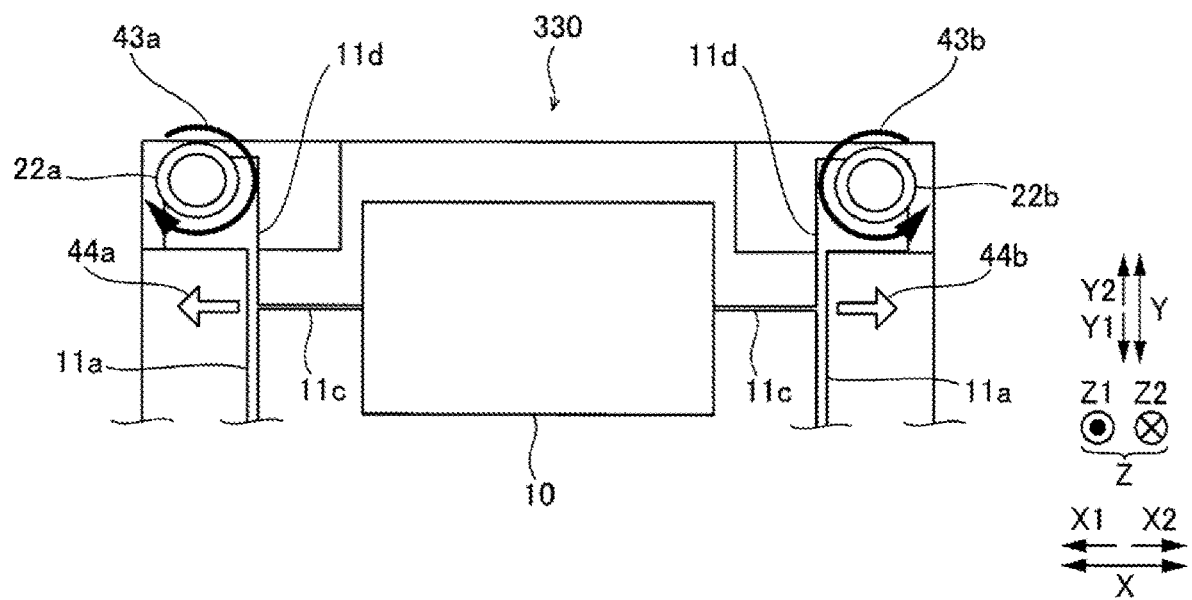
FIG. 14 is a schematic view showing tightening directions of a first screw member and a second screw member according to the fifth embodiment.

As shown in FIG. 14, each of the fixing parts 11d is fixed to the holding member 330 by the first screw member 22a and the second screw member 22b. The first screw member 22a is fastened to the first screw hole 21a. The tightening direction (the direction in which the tightening torque acts) of the first screw member 22a is a direction indicated by arrow 43a. Therefore, the fixing part 11d on the X1 direction side is fixed to the holding member 330 in a rotating orientation indicated by arrow 43a. In other words, as the first screw member 22a is tightened, the fixing part 11d on the X1 direction side rotates in the direction indicated by arrow 43a and is fixed to the holding member 13. Since the fixing part 11d on the X1 direction side rotates in the direction indicated by arrow 43a and is fixed to the holding member 330, the support beam part 11a on the X1 direction side is displaced to the X1 direction side. Accordingly, in the support beam part 11a on the X1 direction side, a force is generated in a direction indicated by arrow 44a. Therefore, tension is applied to the torsion beam part 11c on the X1 direction side in the direction indicated by arrow 44a.

Further, the second screw member 22b is fastened to the second screw hole 21b. The tightening direction of the second screw member 22b is a direction indicated by arrow 43b. Therefore, the fixing part 11d on the X2 direction side is fixed to the holding member 330 in a rotating orientation indicated by arrow 43b. In other words, as the second screw member 22b is tightened, the fixing part 11d on the X2 direction side rotates in the direction indicated by arrow 43b and is fixed to the holding member 330. Since the fixing part 11d on the X2 direction side rotates in the direction indicated by arrow 43b and is fixed to the holding member 330, the support beam part 11a on the X2 direction side is displaced to the X2 direction side. Accordingly, in the support beam part 11a on the X2 direction side, a force is generated in a direction indicated by arrow 44b. Therefore, tension is applied to the torsion beam part 11c on the X2 direction side in the direction indicated by arrow 44b.

The other configurations of the vibrating element 401 according to the fifth embodiment are the same as those of the first embodiment.

Effect of Fifth Embodiment

In the fifth embodiment, as described above, the vibrating element 401 includes the movable part 14 reflecting light, the substrate 11 made of metal, the driving source 12, and the holding member 330. The substrate 11 includes the pair of support beam parts 11a each having the first end part 111a and the second end part 111b, the support part 11b supporting the first end part 111a of each of the pair of support beam parts 11a, and the torsion beam part 11c which swingably supports the movable part 14. The driving source 12 is provided on the support part 11b and generates a plate wave which swings the movable part 14. The holding member 330 holds the substrate 11. The second end part 111b of each of the pair of support beam parts 11a is provided with the fixing part 11d fixed to the holding member 330. By adjusting the fixing orientation in the fixing plane, the fixing part 11d is fixed to the holding member 330 in a state in which each of the pair of support beam parts 11a applies tension to the torsion beam part 11c in a direction away from the movable part 14 in the first direction in which the torsion beam part 11c extends. Accordingly, similar to the vibrating element 1 according to the first embodiment, in the vibrating element 401 according to the fifth embodiment, it is also possible to suppress displacement of the movable part 14 while suppressing complication of the manufacturing process.

Further, in the fifth embodiment, as described above, the first screw member 22a for fixing one of the pair of fixing parts 11d and the second screw member 22b for fixing the other of the pair of fixing parts 11d are included, and the holding member 330 is provided with the first screw hole 21a to which the first screw member 22a is fastened and the second screw hole 21b to which the second screw member 22b is fastened. The first screw hole 21a and the second screw hole 21b are configured so that the force applied to one of the pair of support beam parts 11a via one fixing part 11d when the first screw member 22a is tightened, and the force applied to the other of the pair of support beam parts 11a via the other fixing part 11d when the second screw member 22b is tightened are directed in directions away from the movable part 14 in the first direction (X direction).

Accordingly, by fixing the pair of fixing parts 11d respectively by the first screw member 22a and the second screw member 22b, since a force in a direction away from the movable part 14 in the first direction (X direction) is applied to each of the pair of support beam parts 11a, the position of each of the pair of support beam parts 11a can be easily changed to a position away from the movable part 14 in the first direction (X direction). As a result, tension in a direction away from the movable part 14 in the first direction can be easily applied to the torsion beam part 11c via the support beam part 11a. Further, by adjusting the tightening condition (i.e., the angle of the screw member) of the first screw member 22a and the second screw member 22b, the direction in which the fixing part 11d is fixed in the fixing plane can be easily adjusted. As a result, since the position of the pair of support beam parts 11a in the fixing plane can be easily changed by adjusting the direction in which the fixing part 11d is fixed in the fixing plane, the tension applied to the torsion beam part 11c via the support beam part 11a can be easily adjusted.

The other effects of the fifth embodiment are the same as those of the first embodiment.

MODIFICATION EXAMPLE

The embodiments disclosed herein are exemplary in all respects and are not regarded as restrictive. The scope of the disclosure is shown by the claims rather than the description of the embodiments presented above. In addition, all changes (modifications) within the meaning and scope of the claims are included.

Figure 15:
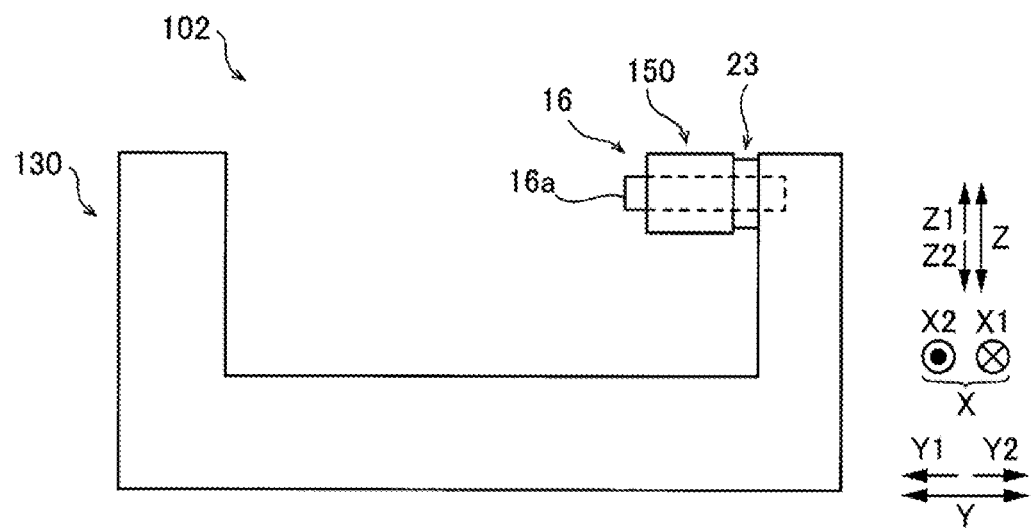
FIG. 15 is a schematic view showing a mounting position of a second spacer member according to a modification example of the second embodiment.

For example, the second embodiment shows an example of a configuration in which the abutting member 150 is directly provided on the holding member 130 by the fixing angle adjustment mechanism 16, but the disclosure is not limited thereto. For example, as in a vibrating element 102 according to a modification example of the second embodiment shown in FIG. 15, a second spacer member 23 may be further provided.

In the modification example of the second embodiment, the abutting member 150 is configured so that the fixing position of the fixing part 11d in the direction (Y direction) in which the support beam part 11a extends can be adjusted by the second spacer member 23.

Figure 16:
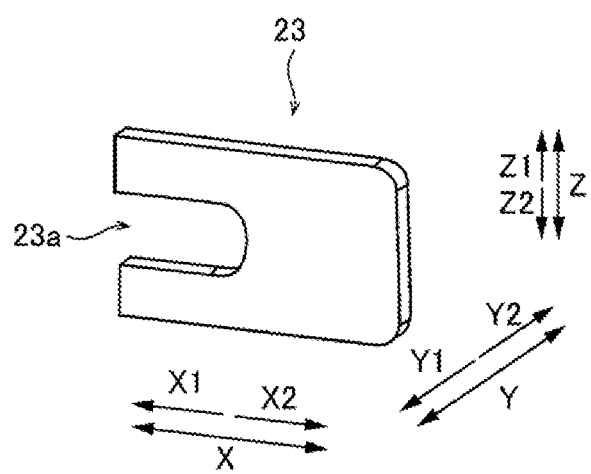
FIG. 16 is a schematic view showing the second spacer member according to the modification example of the second embodiment.

As shown in FIG. 16, the second spacer member 23 has a flat plate shape. Further, the second spacer member 23 is provided with a notch 23a extending in the X direction. Since the second spacer member 23 shown in FIG. 16 is provided between the abutting member 150 on the X2 direction side and the holding member 130, the notch 23a is provided on the X1 direction side. Although not shown, in the second spacer member 23 provided on the X1 direction side, the notch 23a is provided on the X2 direction side. By fitting to the screw member 16a, the notch 23a is provided between the abutting member 150 and the holding member 130.

As described above, the modification example of the second embodiment further includes the second spacer member 23 arranged between the abutting part (the abutting member 150) and the holding member 130 in the direction in which the support beam part 11a extends, and the abutting part is configured so that the fixing position of the fixing part 11d in the direction (Y direction) in which the support beam part 11a extends can be adjusted by the second spacer member 23. Accordingly, since it is possible to adjust the fixing position of the fixing part 11d in the direction in which the support beam part 11a extends, it is possible to reduce an error in the fixing position of the fixing part 11d during assembly even if there are manufacturing tolerances that occur in the substrate 11 and the holding member 130. As a result, the vibrating element 102 can be easily manufactured.

Further, the fourth embodiment shows an example of a configuration in which the through hole 30 is provided in the fixing part 11d, but the disclosure is not limited thereto. For example, as in a vibrating element 302 of a modification example of the fourth embodiment shown in FIG. 17, the fixing part 11d may be provided with a fixing position adjustment part 24 in place of the through hole 30.

Figure 17:
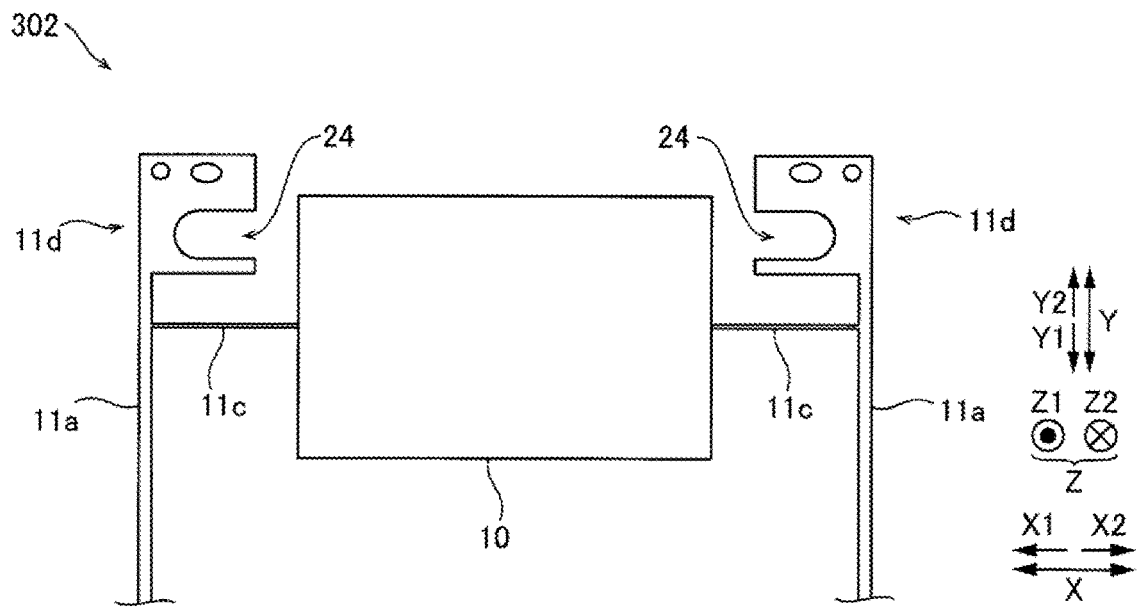
FIG. 17 is a schematic view showing a fixing position adjustment part according to a modification example of the fourth embodiment.
Figure 18:
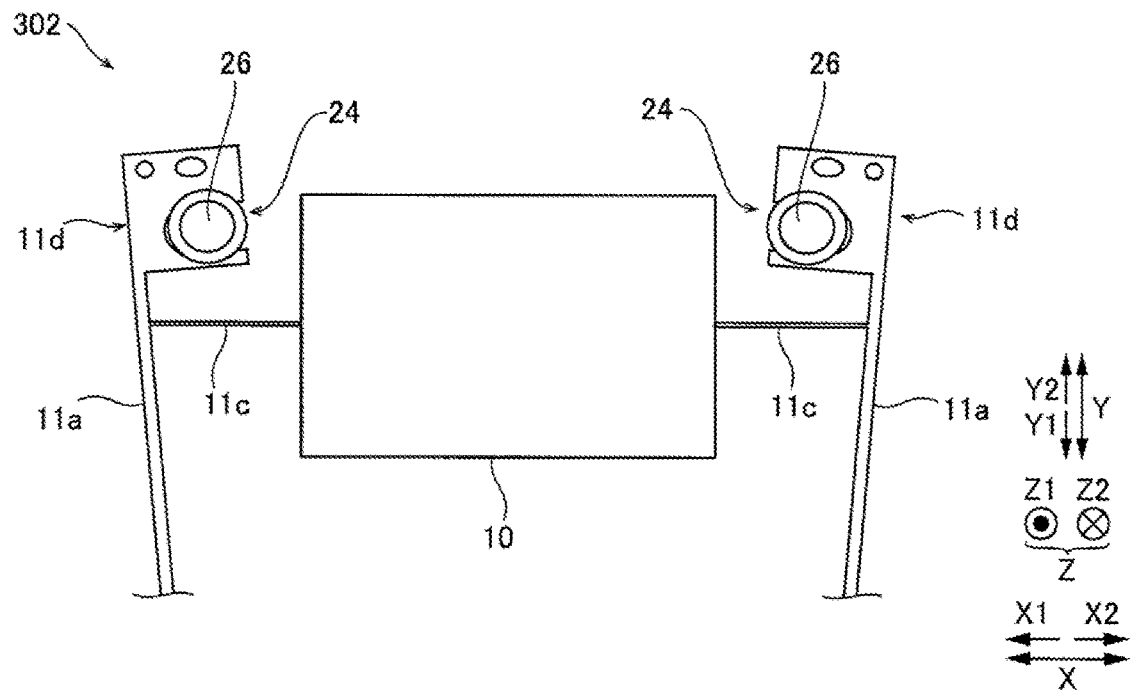
FIG. 18 is a schematic view showing a configuration for fixing a fixing part according to the modification example of the fourth embodiment.

As shown in FIG. 17, the fixing position adjustment part 24 is configured to penetrate the fixing part 11d in the thickness direction (Z direction) of the fixing part 11d and extend along the first direction (X direction). Also, as shown in FIG. 18, the fixing part 11d is fixed to the holding member 13 in a state in which the position adjustment in the fixing plane is performed by a fixing member 26 inserted through the fixing position adjustment part 24. The fixing member 26 includes, for example, a screw member.

In the modification example of the fourth embodiment, as described above, in the case where the support beam part 11a is fixed to the holding member 13 in a bent state, the fixing part 11d has the fixing position adjustment part 24 which penetrates the fixing part 11d in the thickness direction (Z direction) of the fixing part 11d and extends along the first direction (X direction). The fixing part 11d is fixed to the holding member 13 in a state in which the position adjustment in the fixing plane is performed by the fixing member 26 inserted through the fixing position adjustment part 24. Accordingly, since the fixing position adjustment part 24 extends in the first direction, the distance D2 (see FIG. 12) between the second end parts 111b in the first direction when the fixing part 11d is fixed to the holding member 13 can be easily adjusted. As a result, the magnitude of the tension to be applied to the torsion beam part 11c via the support beam part 11a can be easily adjusted.

Further, the first embodiment shows an example of a configuration in which the fixing part 11d is fixed in a twisted state in which the first portion 110a on the side close to the movable part 14 in the first direction (X direction) rotates in a direction (Z1 direction) from the rear surface 14b side toward the front surface 14a side of the movable part 14, but the disclosure is not limited thereto. For example, the fixing part 11d may be fixed to the holding member 13 in a twisted state in which the second portion 110b of the fixing part 11d on the side far from the movable part 14 in the first direction rotates in a direction (Z2 direction) from the front surface 14a side toward the rear surface 14b side of the movable part 14.

Further, the first to fifth embodiments show an example of a configuration of fixing to the holding member 13 in a state in which the support beam part 11a is twisted in a direction in which, of the end parts of the torsion beam part 11c, the end part connected to the movable part 14 protrudes toward the front surface 14a side of the movable part 14, but the disclosure is not limited thereto. For example, it is also possible that the support beam part 11a is not twisted in a direction in which the end part connected to the movable part 14 protrudes toward the front surface 14a side of the movable part 14.

Further, the first to fifth embodiments show an example of a configuration in which a plurality of abutting parts 15 or abutting members 150 are provided, but the disclosure is not limited thereto. For example, the abutting part 15 or the abutting member 150 may be integrally configured and may have abutting surfaces on the X1 direction side and the X2 direction side of the holding member.

Further, the first to fifth embodiments show an example of a configuration in which the fixing part 11d is fixed to the holding member 13 by a screw member, but the disclosure is not limited thereto. For example, the fixing part 11d may be fixed to the holding member 13 by an adhesive or the like. The fixing part 11d may be fixed by any method as long as the fixing part 11d is fixed to the holding member 13 in a state in which each of the pair of support beam parts 11a applies tension to the torsion beam part 11c in a direction away from the movable part 14 in the first direction in which the torsion beam part 11c extends, by adjusting any of the inclination with respect to the holding member 13, the fixing position with respect to the holding member 13 in the fixing plane along the front surface of the substrate 11, and the fixing orientation in the fixing plane.

Further, the first to third embodiments show an example of a configuration in which the first portion 110a of the fixing part 11d is arranged on the Z1 direction side with respect to the second portion 110b, but the disclosure is not limited thereto. For example, the first portion 110a may be configured to be arranged on the Z2 direction side with respect to the second portion 110b.

Further, the third embodiment shows an example of a configuration in which the first spacer member 17 is arranged on a side closer to the movable part 14 than the auxiliary spacer member 18 in the first direction (X direction), but the disclosure is not limited thereto. For example, the first spacer member 17 may be arranged on a side farther from the movable part 14 than the auxiliary spacer member 18 in the first direction.

Further, the third embodiment shows an example of a configuration including the first spacer member 17 and the auxiliary spacer member 18, but the disclosure is not limited thereto. For example, it is also possible that the auxiliary spacer member 18 is not included. However, in the case of a configuration in which the auxiliary spacer member 18 is not provided, when the fixing part 11d is fixed by a screw member, it cannot be fixed stably. Therefore, in the case where the fixing part 11d is fixed by a screw member, the auxiliary spacer member 18 may be provided. Alternatively, in the case of a configuration in which the auxiliary spacer member 18 is not provided, the fixing part 11d may be fixed by an adhesive or the like.

Further, the first to fifth embodiments show an example of a configuration in which the mirror 10 is used as the member to be arranged on the movable part 14, but the disclosure is not limited thereto. For example, a lens may be arranged on the movable part 14.

Further, the first to fifth embodiments show an example of a configuration in which the mirror 10 is used as the member to be arranged on the movable part 14, but the disclosure is not limited thereto. For example, a light emitting element may be arranged on the movable part 14.

Further, the first to fifth embodiments show an example of a configuration in which the mirror 10 is used as the member to be arranged on the movable part 14, but the disclosure is not limited thereto. For example, a light receiving element may be arranged on the movable part 14. Further, the light emitting element and the light receiving element may both be arranged on the movable part 14.

Further, the first to fifth embodiments show an example of a configuration in which the mirror 10 is used as the member to be arranged on the movable part 14, but the disclosure is not limited thereto. For example, an enzyme which reacts with air or a gas may be arranged on the movable part 14.

What is claimed is:

1. A vibrating element comprising:
    a movable part;
    a substrate made of metal, comprising:
        a pair of support beam parts each having a first end part and a second end part;
        a support part supporting the first end part of each of the pair of support beam parts; and
        a torsion beam part which swingably supports the movable part;
    a driving source provided on the support part and generating a plate wave which swings the movable part; and a holding member holding the substrate, wherein the second end part of each of the pair of support beam parts is provided with a fixing part fixed to the holding member, and by adjusting any of an inclination with respect to the holding member, a fixing position with respect to the holding member in a fixing plane along a front surface of the substrate, and a fixing orientation in the fixing plane, the fixing part is fixed to the holding member in a state in which each of the pair of support beam parts applies tension to the torsion beam part in a direction away from the movable part in a first direction in which the torsion beam part extends.

2. The vibrating element according to claim 1, wherein, by twisting in directions opposite to each other, the fixing parts are fixed in a state in which the inclination with respect to the holding member is adjusted, or by bending the pair of support beam parts in directions opposite to each other, the fixing parts are fixed in a state in which the fixing position with respect to the holding member in the fixing plane is adjusted.

3. The vibrating element according to claim 2, wherein the fixing part is fixed to the holding member in a twisted state in which, of portions of the fixing part in the first direction, a first portion on a side close to the movable part rotates in a direction from a rear surface side toward a front surface side of the movable part, or in a twisted state in which, of the portions of the fixing part in the first direction, a second portion on a side far from the movable part rotates in a direction from the front surface side toward the rear surface side of the movable part, or the fixing part is fixed to the holding member in a state in which the pair of support beam parts is bent so that a distance between the second end parts of the pair of support beam parts is larger than a distance between the first end parts of the pair of support beam parts.

4. The vibrating element according to claim 3, wherein in a case where the fixing part is fixed to the holding member in a twisted state, the holding member comprises an abutting part having an abutting surface which abuts the fixing part, and the abutting surface is inclined so that a first abutting portion on a side close to the movable part in the first direction and a second abutting portion on a side far from the movable part in the first direction are located at positions different from each other in a second direction orthogonal to a front surface of the movable part.

5. The vibrating element according to claim 4, wherein the abutting part comprises an abutting member provided separately from the holding member, and the vibrating element further comprises a fixing angle adjustment mechanism capable of adjusting an inclination angle of the abutting surface.

6. The vibrating element according to claim 3, wherein in a case where the fixing part is fixed to the holding member in a twisted state, the holding member comprises an abutting part having an abutting surface which abuts the fixing part, and the vibrating element further comprises a first spacer member provided at a position between the fixing part and the abutting surface in a second direction orthogonal to a front surface of the movable part, wherein the fixing part is fixed to the holding member in a state in which the inclination with respect to the holding member is adjusted by the first spacer member.

7. The vibrating element according to claim 4, wherein the fixing part is fixed to the holding member in a state in which the support beam part is twisted in a direction in which, of the torsion beam part, an end part connected to the movable part protrudes toward the front surface side of the movable part.

8. The vibrating element according to claim 4, further comprising a second spacer member arranged between the abutting part and the holding member in a direction in which the support beam part extends, wherein the abutting part is configured to be capable of adjusting the fixing position of the fixing part in a direction in which the support beam part extends by the second spacer member.

9. The vibrating element according to claim 3, wherein in a case of fixing to the holding member in a state in which the support beam part is bent, the fixing part has a fixing position adjustment part which penetrates the fixing part in a thickness direction of the fixing part and extends along the first direction, and the fixing part is fixed to the holding member in a state in which position adjustment in the fixing plane is performed by a fixing member inserted through the fixing position adjustment part.

10. The vibrating element according to claim 3, comprising a first screw member which fixes one of the pair of fixing parts and a second screw member which fixes another of the pair of fixing parts, wherein the holding member is provided with a first screw hole to which the first screw member is fastened and a second screw hole to which the second screw member is fastened, and the first screw hole and the second screw hole are configured so that each of a force applied to one of the pair of support beam parts via the one of the fixing parts when the first screw member is tightened, and a force applied to another of the pair of support beam parts via the another of the fixing parts when the second screw member is tightened is directed in a direction away from the movable part in the first direction.

* * * * *